(12) United States Patent
Haynie et al.

(10) Patent No.: US 6,797,547 B2
(45) Date of Patent: Sep. 28, 2004

(54) BLADED SILICON-ON-INSULATOR SEMICONDUCTOR DEVICES AND METHOD OF MAKING

(75) Inventors: Sheldon D. Haynie, Amherst, NH (US); Steven L. Merchant, Bedford, NH (US); Sameer P. Pendharkar, Richardson, TX (US); Vladimir Bolkhovsky, Framingham, MA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/679,220

(22) Filed: Oct. 3, 2003

(65) Prior Publication Data

US 2004/0129976 A1 Jul. 8, 2004

Related U.S. Application Data

(62) Division of application No. 10/321,423, filed on Dec. 17, 2002.

(51) Int. Cl.$^7$ .............................................. H01L 21/00
(52) U.S. Cl. ...................... 438/149; 438/479; 438/517; 438/310; 438/311; 438/412; 438/282; 257/347; 257/349; 257/507
(58) Field of Search .................... 438/149, 479, 438/517, 282, 298, 910, 152–156, 309, 311, 164, 412; 257/347–354, 507

(56) References Cited

U.S. PATENT DOCUMENTS

| 6,121,148 | A | * | 9/2000 | Bashir et al. ............... 438/692 |
| 6,352,882 | B1 | * | 3/2002 | Assaderaghi et al. ....... 438/155 |
| 6,492,244 | B1 | * | 12/2002 | Christensen et al. ........ 438/404 |
| 6,524,929 | B1 | * | 2/2003 | Xiang et al. ............... 438/424 |

* cited by examiner

*Primary Examiner*—David Nelms
*Assistant Examiner*—Andy Huynh
(74) *Attorney, Agent, or Firm*—W. Daniel Swayze, Jr.; W. James Brady; Frederick J. Telecky, Jr.

(57) ABSTRACT

A semiconductor device includes an elongated, blade-shaped semiconductor element isolated from a surrounding region of a semiconductor substrate by buried and side oxide layers. A polysilicon post disposed at one end of the element has a bottom portion extending through the buried oxide to contact the substrate, providing for electrical and thermal coupling between the element and the substrate and for gettering impurities during processing. A device fabrication process employs a selective silicon-on-insulator (SOI) technique including forming trenches in the substrate; passivating the upper portion of the element; and performing a long oxidation to create the buried oxide layer. A second oxidation is used to create an insulating oxide layer on the sidewalls of the semiconductor element, and polysilicon material is used to fill the trenches and to create the post. The process can be used with conventional bulk silicon wafers and processes, and the blade devices can be integrated with conventional planar devices formed on other areas of the wafer.

11 Claims, 5 Drawing Sheets

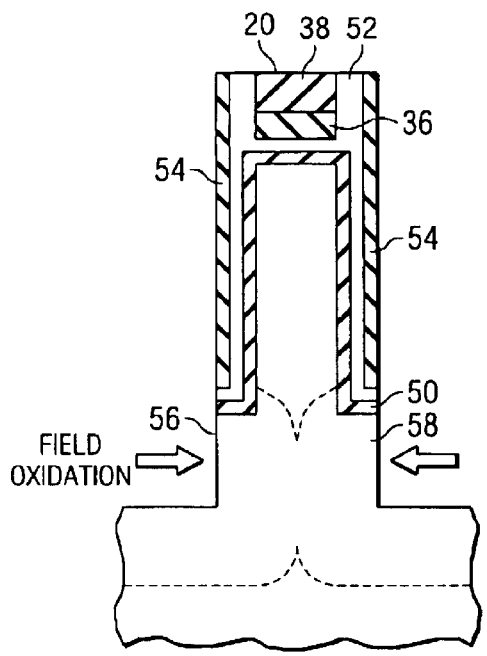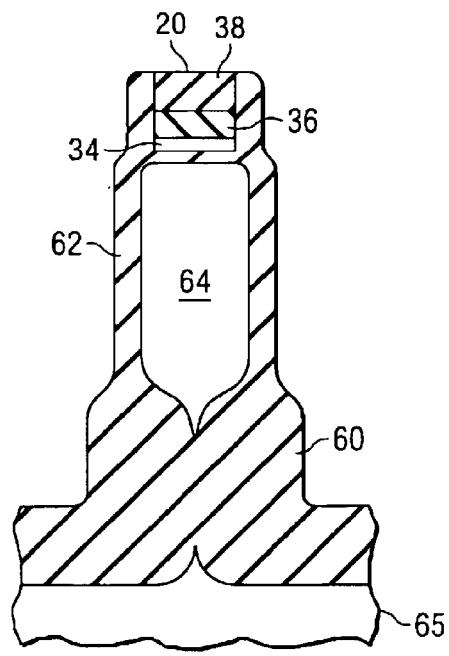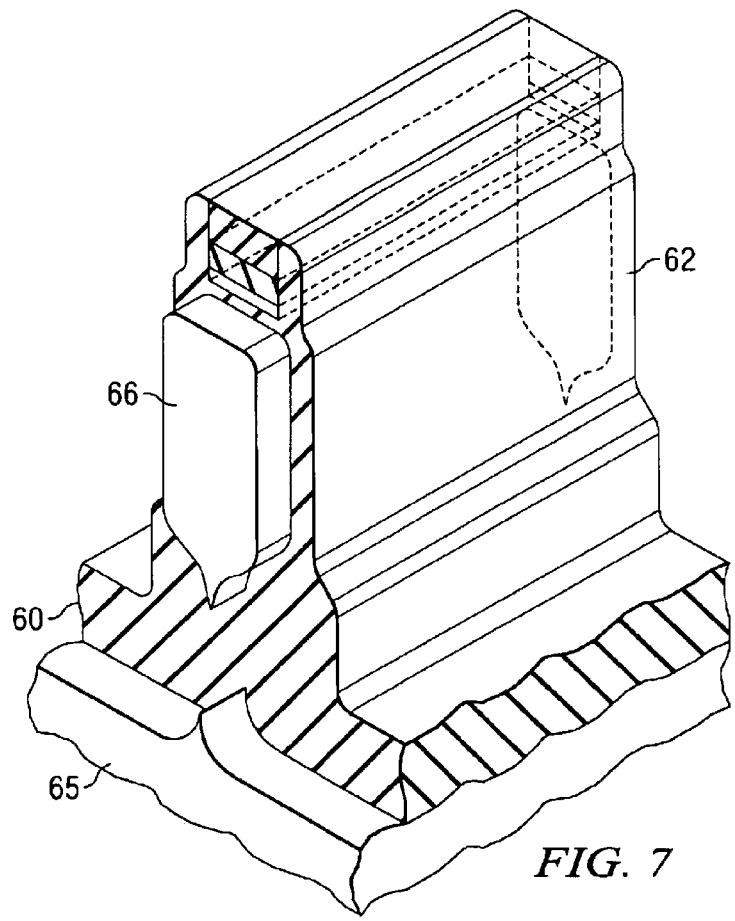

BLADED SILICON-ON-INSULATOR SEMICONDUCTOR DEVICES AND METHOD OF MAKING

CROSS REFERENCE TO RELATED APPLICATIONS

This application claims priority under 35 USC § 120 of application Ser. No. 10/321,423, filed Dec. 17, 2002. This application is a divisional of the above mentioned application.

STATEMENT REGARDING FEDERALLY SPONSORED RESEARCH OR DEVELOPMENT

Not Applicable

BACKGROUND OF THE INVENTION

The present invention relates to the field of semiconductor electronics, and more particularly to power semiconductor devices and methods of manufacturing such devices.

In the field of power semiconductor devices, such as power metal-oxide-semiconductor field-effect transistors (MOSFETs), devices are often characterized according to their "safe operating areas". Generally, the term "safe operating area" refers to operating conditions that are tolerated by a device without failure. More specifically, safe operating area can be defined as a set of maximum values of certain operating parameters. These operating parameters include maximum device current, maximum device voltage, and maximum device power dissipation. Of these parameters, all but the maximum device voltage can be influenced by changing the size of a device—larger devices generally have higher maximum current and higher maximum power dissipation. However, larger devices also occupy more area, and therefore cost more. Thus, there can be a trade-off between safe operating area and cost. As a general matter, it is desirable to maximize the safe operating area of a power device within given cost constraints to permit use of the device in a variety of applications.

It has been known to make power MOSFETs using a technology known as "silicon on insulator" or SOI. The basic characteristic of SOI technology is the presence of a buried layer of oxide forming a dielectric boundary between a bulk silicon substrate and a relatively thin silicon layer on which the active devices are formed. The benefits of SOI technology include higher device operating speed and improved electrical isolation, both owing to the use of oxide isolation rather than reverse-biased junction isolation.

Although SOI technology provides desirable benefits, it also has certain undesirable drawbacks. One of these is cost. The cost of an SOI wafer used as the starting point in device fabrication is considerably higher than the cost of non-SOI wafers. Additionally, the buried oxide layer in an SOI device is a relatively poor conductor of heat and therefore impedes vertical heat flow in the device. Thus, SOI devices generally suffer more "self heating" than do devices formed on bulk silicon, and this self heating can unduly limit the maximum permissible power dissipation for a device. Another drawback in SOI arises during the manufacturing process. During the processing of SOI wafers, impurities in the active silicon layer cannot migrate vertically across the buried oxide layer, and therefore can become trapped in the active device layer. These trapped impurities tend to collect near the surface, reducing the quality of the gate oxides and contributing to poor device performance and device failure. Special techniques are required to compensate for this tendency of impurities to be drawn to the gate oxide areas.

A technique called "partial SOI" has recently been described in the semiconductor literature. For example, a paper by Cai et al. entitled "A Partial SOI Technology for Single-Chip RF Power Amplifiers" describes the creation of an area of "partial SOI" in the drain region of a MOSFET by inserting a thick oxide layer under the drain diffusion. The thick oxide layer is obtained by first forming narrow deep trenches in the drain region and then oxidizing the lower part of the trenches laterally until the oxide completely consumes the silicon below the drain, isolating the drain from the substrate. The drain consists of multiple segments of silicon that are separated by polysilicon "fill" placed in the trenches. The drain segments are electrically interconnected by a metal drain contact extending across the width of the device. The channel, source, and sinker regions of the MOSFET remain located on bulk silicon. The paper states that the resulting device has reduced drain-substrate capacitance and reduced leakage, providing for higher power gain and higher 'power-added efficiency' in this RF device.

BRIEF SUMMARY OF THE INVENTION

In accordance with the present invention, semiconductor devices and related manufacturing methods are disclosed that address some of the shortcomings of the prior art as discussed above. In particular, the disclosed semiconductor devices obtain many of the advantages of traditional SOI-based devices, such as relatively high speed and good electrical isolation, without suffering the above-described drawbacks to the same degree as traditional SOI devices. Additionally, the disclosed devices and methods offer different advantages from those offered by the approach of "partial SOI" as described in the above-referenced paper of Cai et al.

A disclosed semiconductor device includes an elongated semiconductor element formed in a planar semiconductor substrate such as a semiconductor wafer. The semiconductor element is isolated from a surrounding conductive region of the semiconductor substrate by a buried oxide layer and side oxide layers. The oxide isolation imparts SOI-like characteristics to the device, including excellent electrical isolation. In one embodiment, the semiconductor element has a "blade" shape, extending relatively deeply into the semiconductor substrate while being relatively narrow in the horizontal direction perpendicular to its long axis.

The disclosed device further includes a polysilicon "post" disposed at one end of the semiconductor element. A sidewall of the post is in contact with a conductive end portion of the semiconductor element, and the bottom of the post extends through the buried oxide to contact the conductive region of the semiconductor substrate. The polysilicon post electrically connects the end of the element to the substrate. The post also provides for betters thermal coupling between the semiconductor element and the semiconductor substrate than in traditional SOI devices. The post also provides for directing impurities away from the surface of the semiconductor element during wafer processing. These benefits are obtained without the need to contact the substrate from the back side.

A disclosed process for fabricating semiconductor devices employs a selective silicon-on-insulator technique including forming trenches in a semiconductor substrate; passivating the upper portion of a semiconductor element remaining between two adjacent trenches; and performing a long oxidation resulting in a buried oxide layer that isolates the semiconductor element from the underlying semiconductor substrate. After partial stripping of the passivation, a second oxidation is performed to create an insulating oxide layer on the sidewalls of the semiconductor element. Additionally, the buried oxide and sidewall oxide may be stripped at one end of the element, and a polysilicon post may be formed at the one end to create an electrical and thermal path between the one end of the element and the substrate. The post also provides a path for "gettering", or directing surface impurities to the substrate during subsequent processing, and itself functions as a gettering site for such impurities.

The above fabrication method results in the selective creation of SOI-like areas on a semiconductor chip or wafer using standard processes, and thus provides the benefits of SOI without incurring the cost of SOI starting material. Additionally, the formation of a polysilicon post during processing provides for improved gettering during wafer processing, as well as the thermal and electrical coupling functions that are desired during device operation.

Other aspects, features, and advantages of the present invention will be apparent from the detailed description that follows.

BRIEF DESCRIPTION OF THE SEVERAL VIEWS OF THE DRAWING

The invention will be more fully understood by reference to the following Detailed Description of the Invention in conjunction with the Drawing, of which:

FIGS. 5, 6 and 7 are views of a pillar of semiconductor material at various points in the processing of FIG. 4;

DETAILED DESCRIPTION OF THE INVENTION

Figure 1:
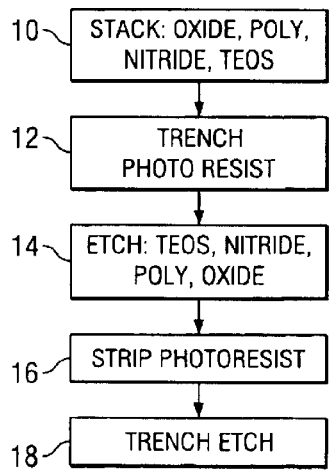
FIG. 1 is a flow diagram of a first part of a selective silicon-on-insulator (SOI) device fabrication process in accordance with the present invention.

FIG. 1 shows an initial part of a process for making bladed semiconductor devices. It is assumed that the starting material is a conventional bulk silicon wafer. The disclosed process can be performed on an entire wafer or on only selected areas of the wafer, leaving remaining areas available for other semiconductor circuitry such as conventional planar devices for example. Such area-selective processing can be accomplished using conventional masking techniques, step-and-repeat operations, etc.

In step 10, a stack of layers is formed on the surface of the wafer, the layers including in order a silicon oxide layer, a polysilicon layer, a nitride layer, and a layer of tetraethylorthosilicate (TEOS). In current semiconductor processes, the thicknesses of each of these layers might be 500 Å, 200 Å, 2000 Å, and 5000 Å respectively. At step 12 a pattern of photoresist is formed that defines areas in which deep trenches are to be formed. In step 14, the TEOS, nitride, poly and oxide layers are selectively etched in the areas for the trenches as defined by the photoresist pattern, and in step 16 the photoresist is stripped away. In step 18, the deep trenches are etched into the surface of the silicon wafer to an appreciable depth, such as 5 μm. This processing is followed by cleaning procedures to remove debris from the processed areas of the wafer.

Figure 2:
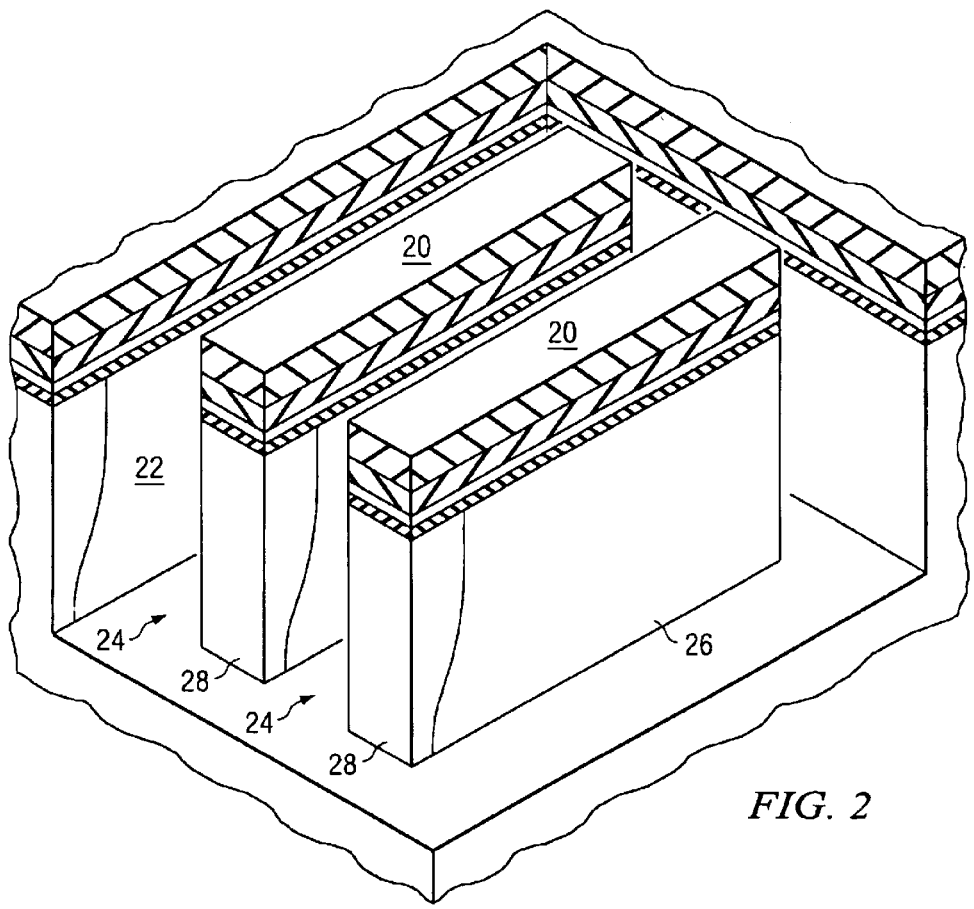
FIG. 2 is a perspective diagram of a portion of a semiconductor wafer upon completion of the process steps of FIG. 1.

FIG. 2 shows an example of the results of the processing of FIG. 1. The trench etching results in the formation of elongated blade-like pillars 20 of silicon topped by remaining portions of the stacked layers. The pillars 20 are separated from each other and from the surrounding substrate 22 by the deep, elongated trenches 24. In the illustrated embodiment, the pillars 20 contain N-well portions 26 and P+ sinker portions 28, which are formed in the substrate after the processing of FIG. 1.

While FIG. 2 shows blade-like pillars 20 having an "I" shape as viewed from above, other shapes are possible in alternative embodiments. Specifically, it may be desirable to create U-shaped or O-shaped structures to achieve certain advantages as discussed below.

Figure 3:
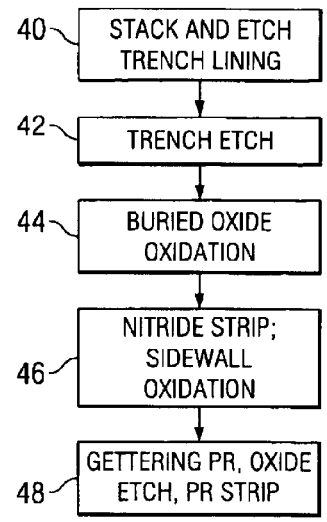
FIG. 3 is an edge view of a pillar of semiconductor material on the partially processed wafer of FIG. 2.

FIG. 3 shows an edge view of a pillar 20 of FIG. 2. The pillar 20 includes a conductive silicon portion 30 on which the following layers reside: an oxide layer 32, a poly layer 34, a nitride layer 36, and a TEOS layer 38. These layers remain after the etching of step 14 of FIG. 1.

Figure 4:
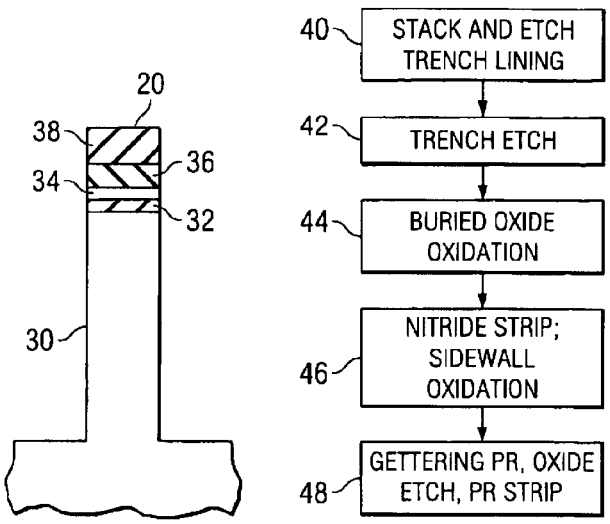
FIG. 4 is a flow diagram of a second part of the SOI device fabrication process.

FIG. 4 shows a second phase of processing that begins with the wafer of FIG. 2. In step 40, a passivating lining for the trenches 24 is formed by stacking oxide, poly and nitride layers as in FIG. 1, and then these layers are etched away from the bottom of the trenches 24. In step 42, the trenches 24 are etched even deeper into the silicon substrate, for example by another 1 μm. Consequently, the pillars 20 become as shown in FIG. 5. The upper part of the sidewalls of each pillar 20 still contain the passivation consisting of the oxide layer 50, poly layer 52, and nitride layer 54, while the lower part of each sidewall 56 has exposed silicon.

Returning to FIG. 4, the next step is to perform a long oxidation to create a buried oxide layer (or BOX). As indicated in FIG. 5, this oxidation is actually a "field" oxidation, but the oxide is grown deeply into both sidewalls 56 at the base of the pillar 20 to completely consume the crystalline silicon throughout an area 58. This is followed in step 46 by stripping of the nitride layer 54 and another oxidation to create an oxide layer on the sidewalls of the pillar 20, which consumes the poly layer 52 on the sidewalls. The result at this point is shown in FIG. 6, where the buried oxide is identified at 60 and the sidewall oxide at 62. As shown, a vertically oriented "slab" or "blade" 64 of silicon remains, completely oxide-isolated from the silicon substrate 65 by the buried oxide 60.

Returning to FIG. 4, the oxidation of steps 44 and 46 is followed by additional steps 48 of applying a photoresist (PR) referred to as a "gettering PR", etching oxide, and stripping photoresist at the source end of the silicon blade 64. As shown in FIG. 7, these steps expose a sidewall of a sinker region 66, shown as consisting of P+ material in the illustrated embodiment. The sinker 66 performs multiple roles, one of which is to assist in gettering impurities away from an active surface area of a device fabricated during additional processing steps as described below.

Figure 8:
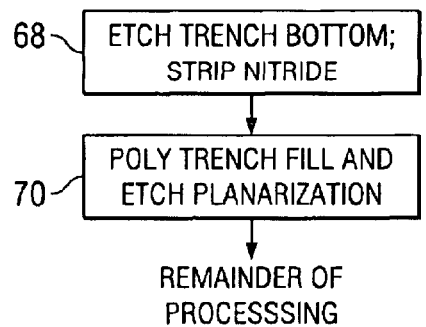
FIG. 8 is a flow diagram of a third part of the SOI device fabrication process.
Figure 9:
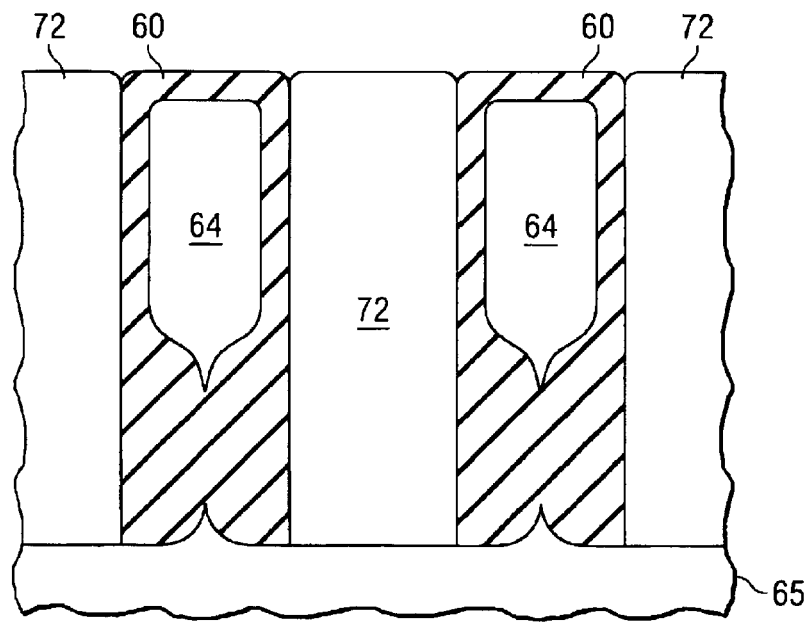
FIG. 9 is a section view of a portion of a semiconductor wafer upon completion of the processing of FIG. 8.

FIG. 8 shows subsequent processing steps. At step 68, the bottoms of the trenches 24 are etched, using for example reactive ion etching, to remove the portion of the base oxide 60 left there after the processes of FIG. 4. Also, the TEOS layer 38 and nitride layer 36 are stripped. These steps are followed by filling the trenches 24 with polysilicon and performing an etch planarization of the wafer at step 70. An end view of the resulting structure, including the poly fill 72, is shown in FIG. 9. It will be observed that the poly fill 72 extends down to the silicon substrate 65.

The processed wafer of FIG. 9 can be seen as starting material for additional processes for creating a finished semiconductor product. It may be that the final product is to comprise only the silicon blades 66 as active transistors, diodes, or other vertical devices. Alternatively, a set of blades 66 may be integrated with conventional complementary circuitry for realizing a more complex function, such as a switching power supply. One of the advantages of the presently disclosed technique is its compatibility with traditional silicon semiconductor processes. Conventional semiconductor processing equipment can be used to carry out the above process steps that result in the blades 66. Additionally, the partially complete device of FIG. 9 can be further processed using conventional processing techniques to realize a variety of semiconductor devices and systems.

Figure 10:
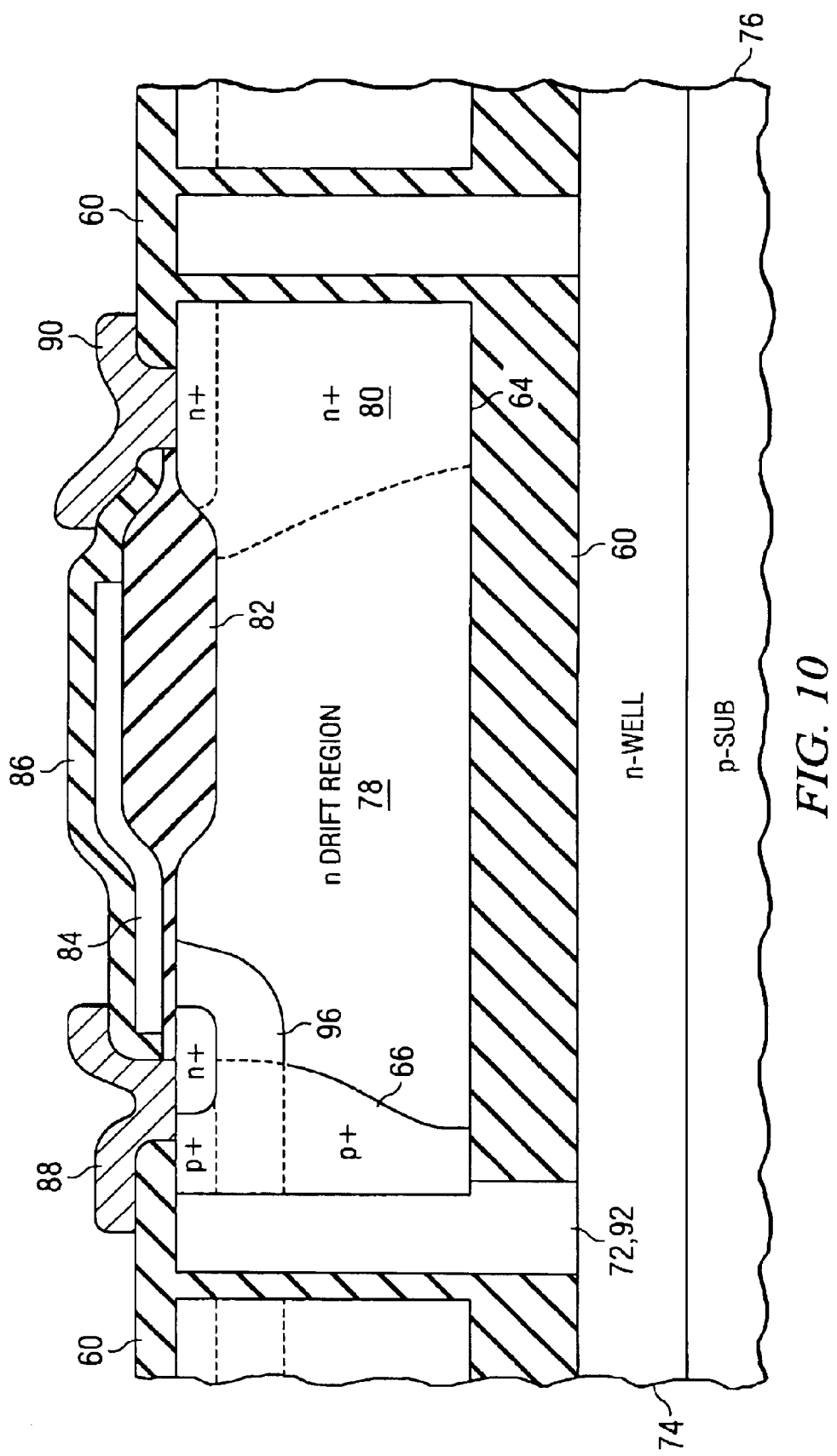
FIG. 10 is a side view of a complete metal-oxide-semiconductor field-effect transistor (MOSFET) formed by additional processing after completion of the process of FIGS. 1, 4 and 8.

FIG. 10 shows an implementation of an N-channel field effect transistor (FET) using the presently disclosed technique. The silicon blade 64 has been formed from an N-well region 74 above a P-type wafer substrate 76. The blade 64 includes a $P^+$ sinker and body region 66, an N-type drift region 78, and an $N^+$ drain region 80. At the surface are formed a region of field oxide (FOX) 82, a polysilicon gate 84, inter-layer dielectric 86, and metal source and drain contacts 88 and 90. In addition, the poly fill 72 at the source end, referred to herein as a "post" 92, is in contact with the $P^+$ sinker 66 and functions in an active manner between the blade 64 and the N well 74 and substrate 76. Specifically, during processing the post 92 provides a gettering path to the substrate 76 for surface impurities. The post 92 may also itself function as a gettering site. During device operation, the post 92 also provides a path for thermal transfer between the blade 64 and the substrate 76, improving the temperature-related performance characteristics of the N-FET.

Figure 11:
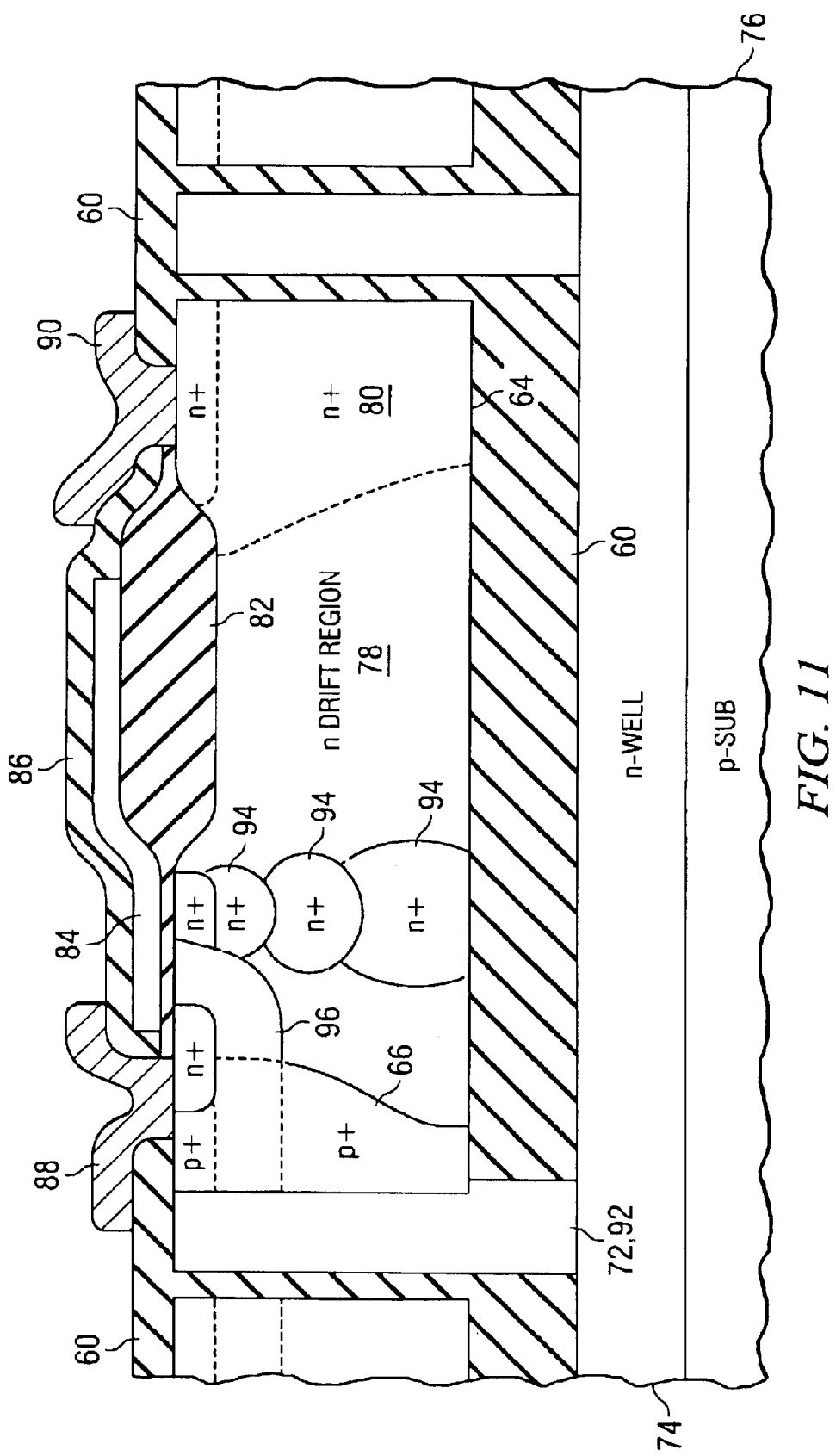
FIG. 11 is a side view of an alternative MOSFET formed by a process including additional steps beyond those of FIGS. 1, 4 and 8.

FIG. 11 shows a transistor like that of FIG. 10 but with a modification that is believed to lower the transistor's "spreading resistance", which arises from uneven current distribution in the drift region 78. Specifically, in a device such as the device of FIG. 10, there tends to be higher current density near the top of the drift region 78, along the underside of the FOX 82, than in other parts of the drift region 78. To channel more current toward the bottom of the drift region 78, the device of FIG. 11 employs a series of $N^+$ implants 94 formed in the drift region 78. These form a floating "virtual drain" that tends to direct current entering the drift region 78 from the gate region 96 in a downward direction. Consequently, the current is spread more widely across the vertical extent of the drift region 78 as it travels in the horizontal direction. In contrast, in a device such as that of FIG. 11, current density tends to be higher immediately under the field oxide 82, and lower at the bottom of the device near the BOX 60.

In the above description, it is assumed that the gate polysilicon 84 is disposed only on the surface. It is possible to extend the gate polysilicon down along the sides of the device to increase the area over which the field effect of the gate influences device current. This extended gate polysilicon can be deposited as part of the deposition of the fill polysilicon 72 (FIG. 9), but it is necessary to interpose an insulator such as an oxide between the extended gate polysilicon and the bulk of the fill polysilicon to provide for electrical isolation therebetween. In such an embodiment, the sidewall oxide 62 (FIG. 6) under such extended gate polysilicon is preferably made approximately as thin as the field oxide 82 (FIG. 10) is above the drift region 78.

In the blade devices shown above, it is desirable to provide for a relatively uniform electric field gradient across the length of the device for greater device reliability and longevity. One technique used to achieve such a uniform electric field gradient is to vary the doping concentration across the length of the device. In particular, a linear doping profile can be used, with relatively low dopant concentration near the $P^+$ sinker 66 and relatively high dopant concentration near the drain region 80.

Figure 12:
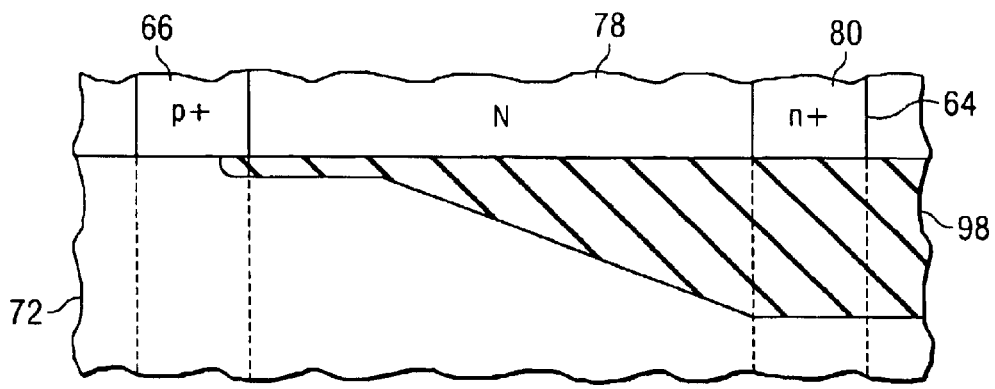
FIG. 12 is a top view of portion of a semiconductor wafer formed by a modified version process of the process of FIGS. 1, 4 and 8.

An alternative technique for promoting a uniform electric field gradient is shown in FIG. 12, which is a top view of a blade device and adjacent poly fill 72. Rather than using a linear doping profile in the blade 64, the structure of FIG. 12 employs a linearly graded sidewall oxide 98. Because of the graded sidewall oxide 98, the spacing between the sidewall of the drift region 78 and the poly fill 72 gradually increases with distance away from the $P^+$ sinker 66. The poly fill 72 will typically be held at zero volts, whereas the voltage along the sidewall of the drift region 78 increases from about zero volts near the $P^+$ sinker 66 to many tens of volts near the drain region 80. Due to the linearly increasing spacing between the device and the poly fill 72, the electric field gradients are lower than the gradients experienced when uniform spacing is used. As compared with the technique of using a linear doping profile, the use of a graded field oxide 98 advantageously provides for lower ON resistance of the device, because the drift region 78 can be uniformly doped at a high level.

While in the above description the pillars 20 are blade-like in shape, in practice there may be drawbacks to using such a shape. Specifically, the pillars 20 may exhibit an undesirable degree of mechanical instability during processing due to the etching of the deep trenches 24 and the oxidation of the base region 58 of the pillars. It may be desirable for the pillars 20 to be shaped differently to improve mechanical stability. For example, rather than each blade appearing as a single I-shaped member as viewed from above, it may be desirable to employ a U-shape or even a substantially closed shape, such as circular or rectangular. It will be appreciated that an insulating gap must remain between the ends of the blade to provide for proper device operation.

It will be apparent to those skilled in the art that modifications to and variations of the disclosed methods and apparatus are possible without departing from the inventive concepts disclosed herein, and therefore the invention should not be viewed as limited except to the full scope and spirit of the appended claims.

What is claimed is:

1. A method of processing a planar semiconductor substrate, comprising:

forming spaced-apart trenches in the semiconductor substrate at one surface thereof so as to define an elongated semiconductor element;

passivating the upper portion of the semiconductor element and performing a first oxidation process to create a buried oxide layer beneath the passivated semiconductor element, the buried oxide layer isolating the semiconductor element from a deeper conductive region of the semiconductor substrate remaining after the first oxidation process;

removing the passivation and performing a second oxidation process to create an isolating side oxide layer on the sides of the semiconductor element;

removing the side oxide layer and buried oxide layer at one end of the semiconductor element so as to expose a conductive end portion of the semiconductor element and an adjacent portion of the conductive region of the semiconductor substrate; and forming a post at the one end of the semiconductor element, the post having a side portion in contact with the conductive end portion of the semiconductor element and a bottom portion in contact with the adjacent portion of the conductive region of the semiconductor substrate, the post comprising a material effective (i) to provide for thermal and electrical coupling between the semiconductor element and the conductive region of the semiconductor substrate, and (ii) to provide for gettering impurities away from a surface portion of the semiconductor element during subsequent processing of the semiconductor substrate.

2. A method according to claim 1, wherein forming trenches comprises:

passivating the one surface of the semiconductor substrates;

applying photoresist to the passivated surface in a pattern defining the locations of the trenches;

etching the passivation at the locations of the trenches as defined by the photoresist;

stripping the photoresist after etching the passivation; and after stripping the photoresist, etching the trenches at the locations defined by the non-passivated areas of the surface.

3. A method according to claim 1, further comprising:

filling the trenches with polysilicon after the isolating side oxide layer has been created on the sides of the semiconductor element; and after filling the trenches with polysilicon, etch planarizing the one surface of the semiconductor substrate.

4. A method according to claim 1, wherein the post material is polysilicon.

5. A method according to claim 1, further comprising forming a sinker diffusion region at the one end adjacent to the post, a drift region extending from the sinker diffusion region toward the other end of the semiconductor element, and a drain diffusion region at the other end of the semiconductor element.

6. A method according to claim 5, further comprising:

forming a layer of field oxide extending across the drift region on the surface of the semiconductor element; and forming a polysilicon gate on the field oxide above the sinker diffusion region.

7. A method according to claim 5, further comprising:

forming a plurality of doped implants extending vertically in the drift region adjacent to the sinker diffusion region to improve the vertical spreading of current in the drift region.

8. A method according to claim 1, further comprising doping the semiconductor element in a non-uniform manner along its length.

9. A method according to claim 8, wherein the dopant concentration varies linearly from one end of the semiconductor element to the other end.

10. A method according to claim 1, further comprising forming a sidewall of insulating material adjacent to one side of the semiconductor element, the sidewall having non-uniform width so as to provide for relatively uniform electric field gradients in the semiconductor element.

11. A method according to claim 10, wherein the width of the sidewall of insulating material varies linearly from one end of the semiconductor element to the other end.

* * * * *